US008938204B2

United States Patent
Oishi

(10) Patent No.: US 8,938,204 B2
(45) Date of Patent: Jan. 20, 2015

(54) SIGNAL GENERATOR CIRCUIT AND RADIO TRANSMISSION AND RECEPTION DEVICE INCLUDING THE SAME

(71) Applicant: Fujitsu Limited, Kawasaki-shi, Kanagawa (JP)

(72) Inventor: Kazuaki Oishi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 196 days.

(21) Appl. No.: 13/733,620

(22) Filed: Jan. 3, 2013

(65) Prior Publication Data

US 2013/0130632 A1 May 23, 2013

Related U.S. Application Data

(63) Continuation of application No. PCT/JP2010/062830, filed on Jul. 29, 2010.

(51) Int. Cl.
| | | |
|---|---|---|
| *H04B 1/40* | (2006.01) | |
| *H04B 1/06* | (2006.01) | |
| *H03B 21/01* | (2006.01) | |
| *H03B 21/02* | (2006.01) | |
| *H04B 1/00* | (2006.01) | |

(52) U.S. Cl.
CPC ............... *H04B 1/403* (2013.01); *H03B 21/01* (2013.01); *H03B 21/02* (2013.01); *H04B 1/0082* (2013.01)
USPC .............. 455/84; 455/258; 455/323; 327/119

(58) Field of Classification Search
USPC ................... 455/84, 131, 255, 258, 313, 323; 327/113–120; 331/38, 40
See application file for complete search history.

(56) References Cited

U.S. PATENT DOCUMENTS

| 6,166,971 A | 12/2000 | Tamura et al. |
| 6,404,293 B1 | 6/2002 | Darabi et al. |

(Continued)

FOREIGN PATENT DOCUMENTS

| JP | 2000-196418 A | 7/2000 |
| JP | 2003-188649 A | 7/2003 |

(Continued)

OTHER PUBLICATIONS

Darabi, et al. A 2.4-GHz CMOS Transceiver for Bluetooth., IEEE Journal of Solid-State Circuits, vol. 36, No. 12, Dec. 2001. pp. 2016-2024.

*Primary Examiner* — Quochien B Vuong
(74) *Attorney, Agent, or Firm* — Arent Fox LLP

(57) ABSTRACT

The disclosed signal generator circuit has a four-phase signal generator circuit generating four-phase signals with a first frequency; an eight-phase signal generator circuit performing ½ frequency division of the four-phase signals to generate eight-phase signals with a second frequency; a first to a fourth harmonic rejection mixer circuits multiplying a first four-phase signal and a second four-phase signal of the four-phase signals by a first to a third eight-phase signals and a third to a fifth eight-phase signals of the eight-phase signals with mutually different combinations; a subtractor subtracting between outputs of the first and the fourth harmonic rejection mixer circuits to generate a first output signal with a third frequency; and an adder adding between outputs of the second and the third harmonic rejection mixer circuits to generate a second output signal with a third frequency whose phase is different from the first output signal by π/2.

10 Claims, 13 Drawing Sheets

(56) References Cited

U.S. PATENT DOCUMENTS

| | | | |
|---|---|---|---|
| 6,570,425 B2* | 5/2003 | Yamaguchi | 327/251 |
| 7,058,150 B2* | 6/2006 | Buchwald et al. | 375/355 |
| 7,826,814 B2* | 11/2010 | Masuda | 455/258 |
| 2003/0078017 A1* | 4/2003 | Casagrande | 455/132 |
| 2006/0160518 A1 | 7/2006 | Seendripu et al. | |

FOREIGN PATENT DOCUMENTS

| | | |
|---|---|---|
| JP | 2005-252861 A | 9/2005 |
| JP | 2008-072564 A | 3/2008 |
| JP | 2008-523734 A | 7/2008 |
| JP | 2009-105959 A | 5/2009 |

* cited by examiner

FIG. 7A  4-phase 1/2 Divider
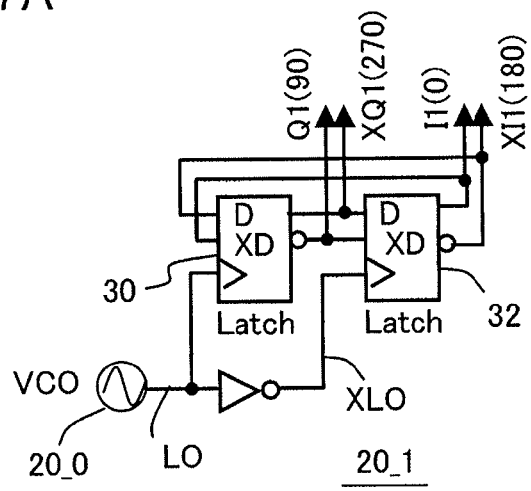
FIG. 7B  8-phase 1/2 Divider
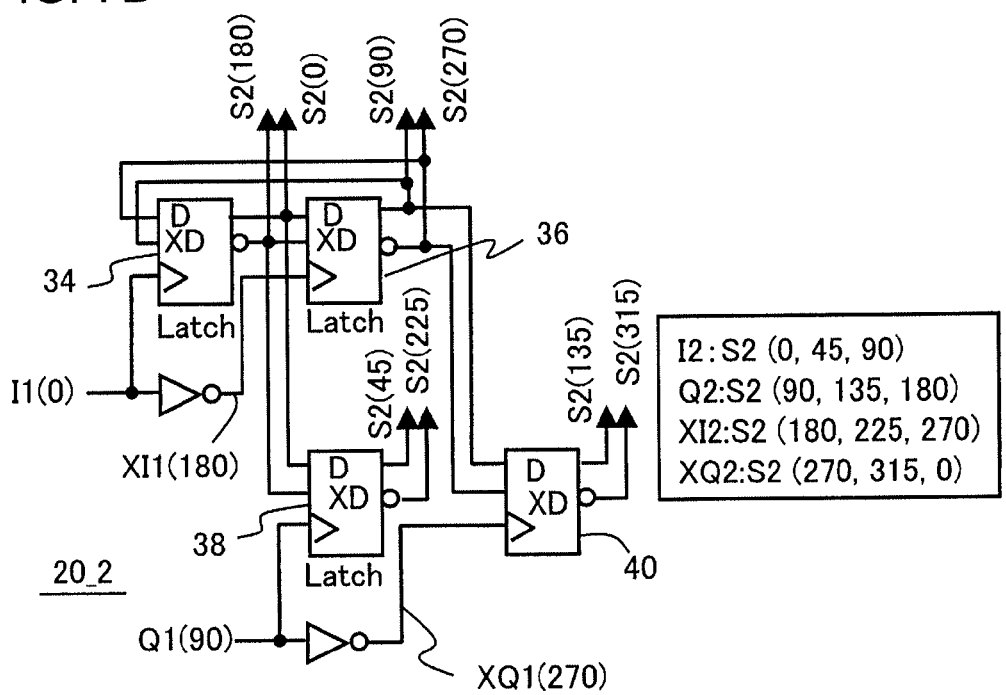

US 8,938,204 B2

SIGNAL GENERATOR CIRCUIT AND RADIO TRANSMISSION AND RECEPTION DEVICE INCLUDING THE SAME

CROSS-REFERENCE TO RELATED APPLICATION

This application is a continuation application of International Application PCT/JP2010/062830 filed on Jul. 29, 2010 and designated the U.S., the entire contents of which are incorporated herein by reference.

FIELD

The present embodiment relates to a signal generator circuit and a radio transmission and reception device including the same.

BACKGROUND

A reception device for radio communication down-converts a high-frequency reception signal received by an antenna, by a mixer circuit (multiplier), so as to convert it into a reception signal of a lower frequency. The low-frequency reception signal is demodulated, and the transmitted data is output through decoding processing etc. The mixer circuit multiplies the high-frequency reception signal by a local signal generated by a local oscillator circuit. Among output signals of the mixer circuit, only low frequency components are extracted by a low-pass filter, so that high frequency components are eliminated. When the reception signal after the down-conversion is a baseband signal, the frequency of the local signal equals to the frequency of the reception signal. In the case that the reception signal after the down-conversion has an intermediate frequency, it is needed to set the local signal frequency to be equal to a difference between the reception signal frequency and the intermediate frequency.

Therefore, in order to receive a wide frequency range, it is needed to vary the local signal frequency in a wide range. However, it is not easy to make a signal generator circuit, which generates local signals, generate a wide frequency range of signals. For example, in the local signal generator circuit which includes a voltage controlled oscillator (VCO), it is not easy to broaden a variable width of the VCO, while the provision of a plurality of VCOs brings about an increased chip area.

Also, in a transmitter circuit for radio communication, a high-frequency circuit in its output stage has a mixer circuit to up-convert a modulated transmission signal into a communication frequency band. To this mixer circuit also, a local signal of the communication frequency band is supplied, similar to the above description, so that the modulated transmission signal is multiplied by the local signal. Therefore, it is also needed to supply a wide frequency range of different local signals to the mixer circuit of the transmission device.

Such local signal generator circuit are described in [Patent document 1] The official gazette of the Japanese Laid-open Patent Publication No. 2000-196418, [Patent document 2] The official gazette of the Japanese Laid-open Patent Publication No. 2009-105959, [Patent document 3] U.S. Pat. No. 6,404,293 B1, and [Non-patent document 1] H. Darabi, "A 2.4 GHz CMOS Transceiver for Bluetooth" IEEE J. Solid-State Circuits, vol. 36, pp. 2016-2024, December 2001

SUMMARY

As described above, if it is possible to generate a local signal with a different frequency from a VCO oscillation frequency, it becomes possible to receive reception signals and transmit transmission signals having a wide frequency range, without mounting a large number of VCOs.

According to a first aspect of the embodiment, a signal generator circuit comprises: a four-phase signal generator circuit which generates four-phase signals with a first frequency; an eight-phase signal generator circuit which performs ½ frequency division of the four-phase signals to generate eight-phase signals with a second frequency which is ½ of the first frequency; a first to a fourth harmonic rejection mixer circuits which multiply a first four-phase signal and a second four-phase signal of the four-phase signals by a first to a third eight-phase signals and a third to a fifth eight-phase signals of the eight-phase signals with mutually different combinations; a subtractor which subtracts between outputs of the first and the fourth harmonic rejection mixer circuits to generate a first output signal with a third frequency which is a sum of the first frequency and the second frequency; and an adder which adds between outputs of the second and the third harmonic rejection mixer circuits to generate a second output signal with a third frequency of which phase is different from a phase of the first output signal by $\pi/2$.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 7A and 7B are diagrams illustrating an example of a four-phase signal generator circuit and an example of an eight-phase signal generator circuit in the signal generator circuit.

DESCRIPTION OF EMBODIMENTS

Figure 1:
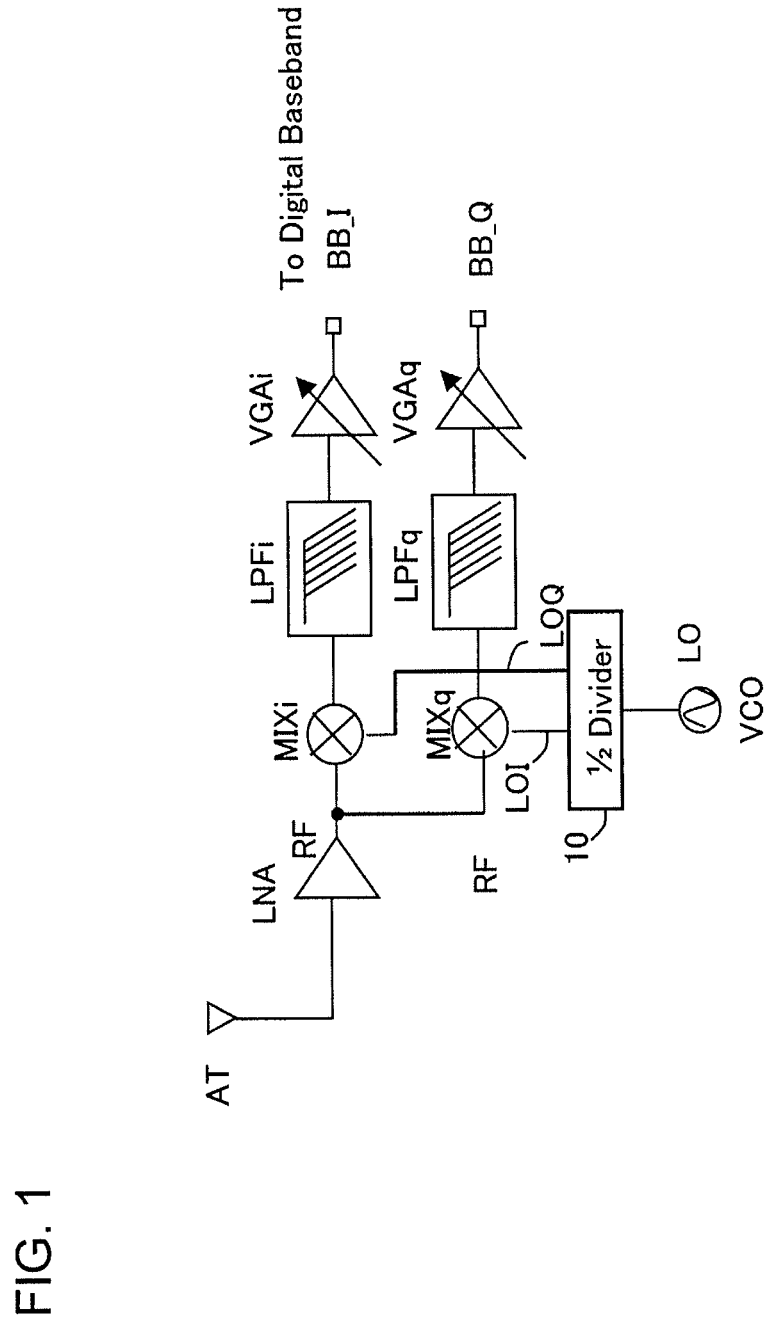
FIG. 1 is a diagram illustrating a radio reception device.

FIG. 1 is a diagram illustrating a radio reception device. The radio reception device includes: a low-noise amplifier LNA which amplifies a high-frequency reception signal received by a reception antenna AT; mixer circuits MIXi, MIXq which multiply the amplified reception signal RF by local signals LOI, LOQ, respectively; low-pass filters LPFi, LPFq which pass low frequency signals among the outputs of the mixer circuits; and variable gain amplifiers VGAi, VGAq which amplify them into constant amplitude. The outputs of the variable gain amplifiers are supplied to a non-illustrated latter-stage digital baseband circuit as baseband signals BB_I, BB_Q of an I-signal and a Q-signal, so that demodulation and decoding processing are performed.

The local signals LOI, LOQ are high frequency signals of which phases are mutually different by 90° (π/2). In the example depicted in FIG. 1, from a signal LO generated by the VCO, a local signal generator circuit 10 generates the local signals LOI, LOQ to be supplied to the mixer circuit. A common local circuit 10 includes a ½ frequency divider, for example, so as to perform ½ frequency division of the oscillator output LO to generate the local signals LOI, LOQ having phases of 0° and 90°, respectively.

To perform orthogonal detection of reception signals of greatly different frequency bands by the mixer circuit, the local signals LOI, LOQ need to have greatly different frequencies corresponding to the frequency bands of the reception signals. For this purpose, it is needed to broaden variable frequency widths of the VCO, which is not easy in view of circuit design. Also, it may be possible to provide a plurality of VCOs to switch over therebetween, however, it is not preferable because of causing a large circuit scale.

A radio transmission device also includes a mixer circuit which multiply modulation signals including an I-component and a Q-component generated by a digital baseband circuit by local signals LOI, LOQ. By this multiplication by the mixer circuit, the modulation signal is up-converted into the communication frequency band. In the transmitter circuit, to perform orthogonal modulation of transmission signals of greatly different frequency bands, the local signals LOI, LOQ also need to have greatly different frequencies corresponding to the above frequency bands.

Figure 2:
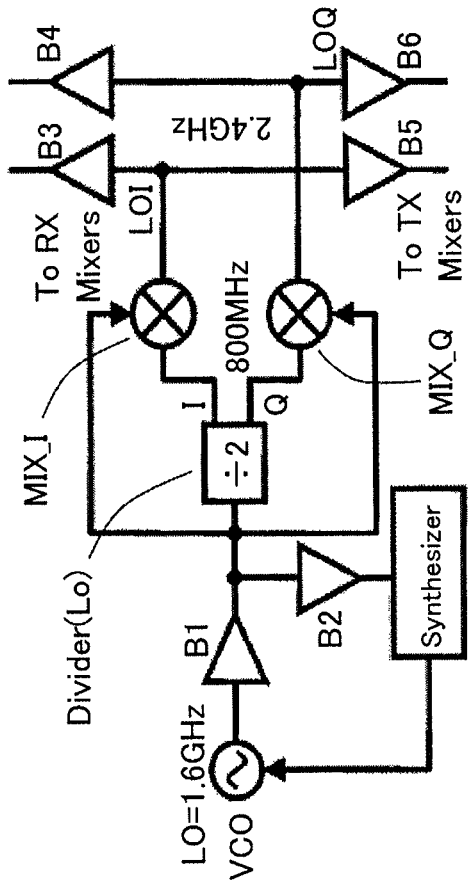
FIG. 2 is a diagram illustrating a signal generator circuit described in the non-patent document 1.

FIG. 2 is a diagram illustrating a signal generator circuit described in the non-patent document 1. A VCO generates a signal LO=1.6 GHz and supplies it to a frequency divider, Divider, through a buffer B1. The frequency divider performs ½ frequency division of the signal LO, to generate two different signals I, Q of which phases are mutually different by 90°. By the above ½ frequency division, each signal I, Q comes to have a frequency of 0.8 GHz. Then, two mixer circuits MIX_I, MIX_Q multiply the signals I, Q by the signal LO, so as to generate the local signals LOI, LOQ of 2.4 GHz (=1.6+0.8). The local signals LOI, LOQ are then supplied to the non-illustrated mixer circuit of the reception device, through buffers B3-B6.

The signal generator circuit depicted in FIG. 2 may generate, from the signal LO of 1.6 GHz frequency, the local signals LOI, LOQ of 2.4 GHz. Therefore, using the oscillation signal LO of the VCO and the local signals LOI, LOQ, reception signals in a 1.6 GHz frequency band and a 2.4 GHz frequency band may be received, respectively. However, because of a delay characteristic etc. of the circuit, there may be a case that the local signals LOI, LOQ of 2.4 GHz frequency may not be generated, depending on the relationship between the phases of the signal LO and the signals I, Q which are input into the mixers MIX_I, MIX_Q. As such, there is a case that stable generation of the local signals may not be achieved.

Figure 3A:
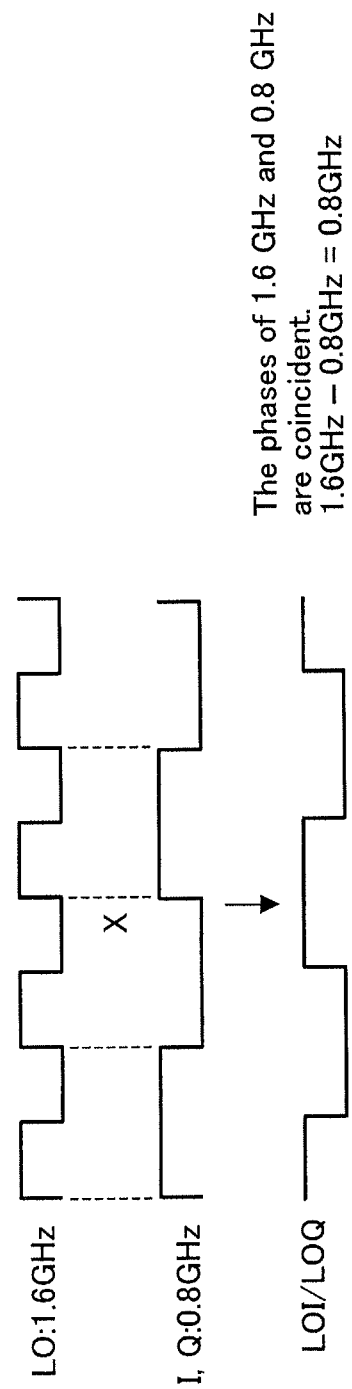
FIGS. 3A and 3B are diagrams illustrating the operation of the signal generator circuit depicted in FIG. 2.
Figure 3B:
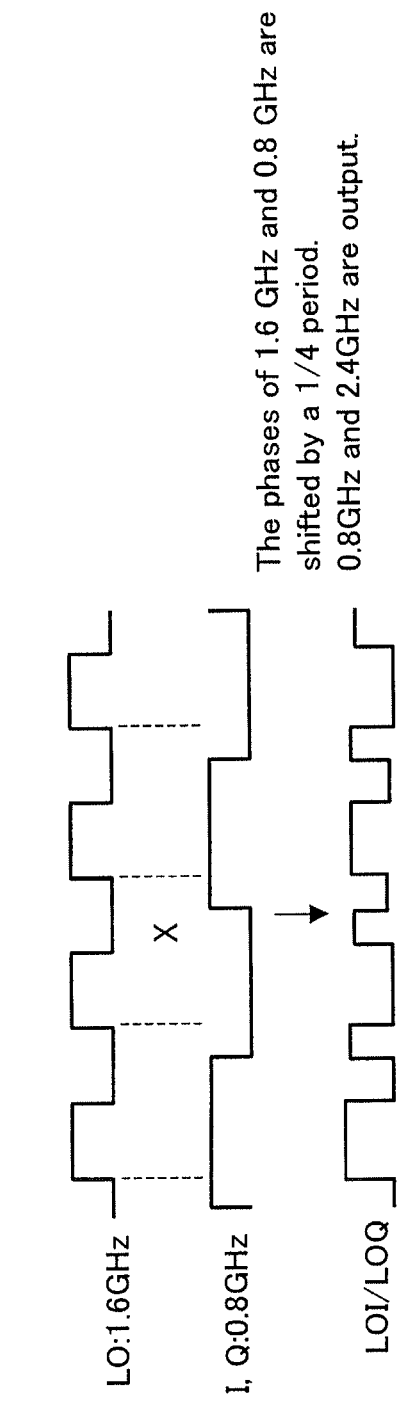

FIGS. 3A and 3B are diagrams illustrating the operation of the signal generator circuit depicted in FIG. 2. FIG. 3A is an example when the phases of the signal LO and each signal I, Q input to each mixer MIX_I, MIX_Q are coincident. The rise edges (phase 0°) of the signal LO and the signal I, Q are coincident. In this case, each local signal LOI, LOQ generated by the mixer MIX_I, MIX_Q has a frequency of 1.6 GHz−0.8 GHz=0.8 GHz, only. The local signal LOI, LOQ depicted in FIG. 3A is a multiplication result of the signal LO by the signal I, Q each having an H level (+1) and a L level (−1), and because of the coincidence of the phases, it is understandable that the local signal LOI, LOQ comes to have an equal frequency to the signal I, Q.

In contrast, FIG. 3B depicts an example when the phases of the signal LO and each signal I, Q input to the mixer MIX_I, MIX_Q are not coincident. The rise edges between the signal LO and the signal I, Q are shifted by a ¼ cycle of the signal I, Q. In this case, the local signal LOI, LOQ generated by the mixer MIX_I, MIX_Q is a mixed signal between a frequency signal of 1.6 GHz−0.8 GHz=0.8 GHz and a frequency signal of 1.6 GHz+0.8 GHz=2.4 GHz. In this case, by making the signal pass through a band-pass filter or a high-pass filter, it is possible to obtain the local signal LOI, LOQ having a frequency of 2.4 GHz only.

Further, in the case of a phase shift between FIGS. 3A, 3B, the signal intensity of 2.4 GHz gradually increases from the state of FIG. 3A, and in FIG. 3B, the signal intensity becomes equivalent between 1.6 GHz and 2.4 GHz.

As such, there is dispersion in the generated local signal frequencies depending on phase relationship between the input signals to the mixer MIX_I, MIX_Q. This phase relationship generally disperses because of the delay characteristic etc. of a circuit. Therefore, it is not easy to design the circuit to continuously prevent from producing such phase relationship as depicted in FIG. 3A.

Figure 4:
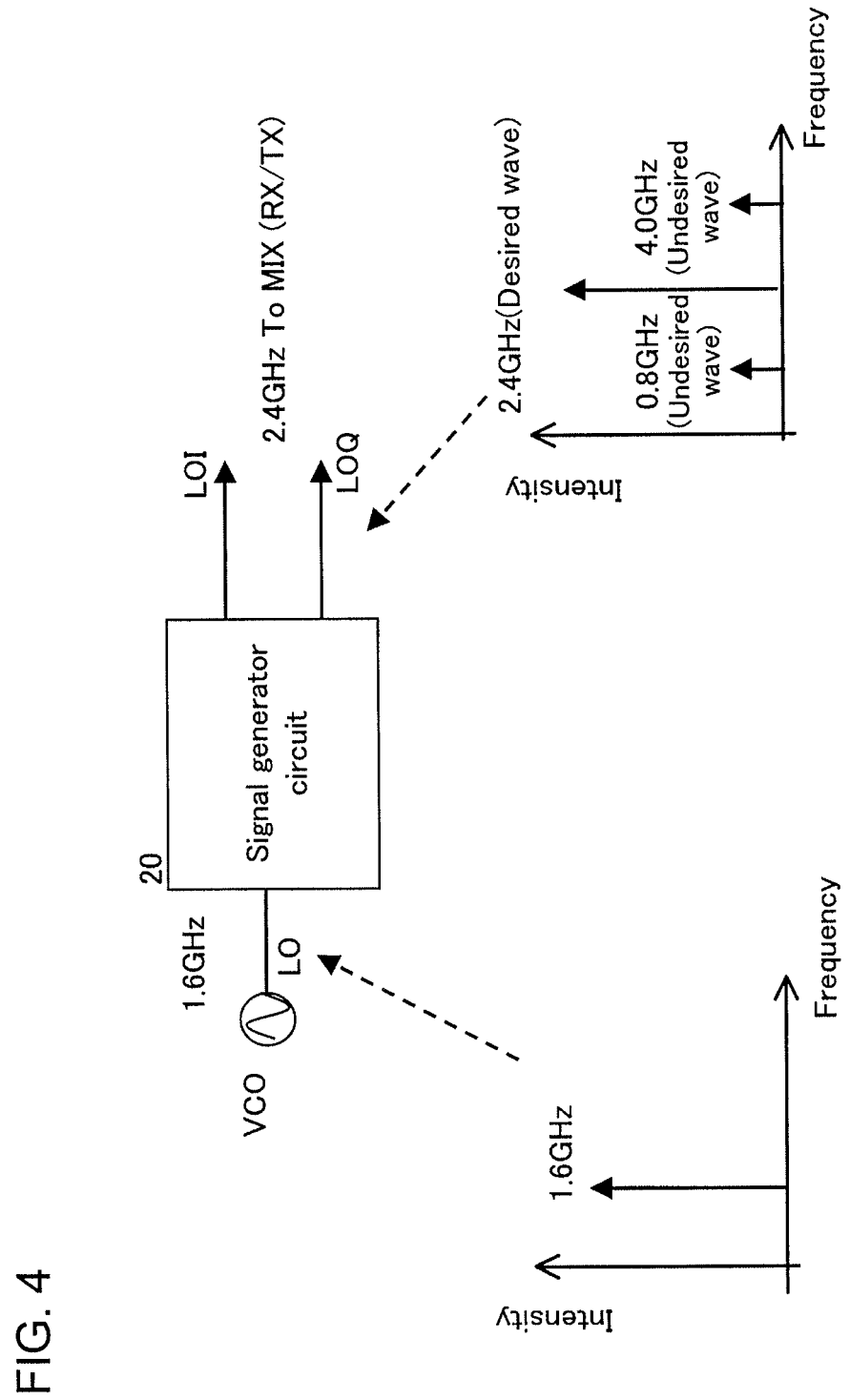
FIG. 4 is a diagram illustrating the frequency spectrum of a signal generated in the signal generator circuit.

FIG. 4 is a diagram illustrating the frequency spectrum of a signal generated in the signal generator circuit. This signal generator circuit 20 generates each local signal LOI, LOQ having a phase shifted by 90° (π/2) from a signal LO generated in the VCO. When the mixer circuits (multipliers) are provided in the signal generator circuit 20 as depicted in FIG. 2, from the character of the multipliers, harmonic waves of the tertiary, the quinary, the septenary, etc. are produced in addition to a desired wave signal having a frequency of 2.4 GHz. If such harmonic waves are included in the local signal, not only a desired wave but undesired waves are produced in multiplication processing of the mixer circuits provided in the reception device and the transmission device.

When the VCO generates the signal LO of a rectangular wave, because harmonic waves are included in the rectangular wave, the local signals LOI, LOQ include harmonic waves resulting therefrom. Therefore, in the local signal generator circuit, it is needed to suppress the generation of the harmonic waves.

Figure 5:
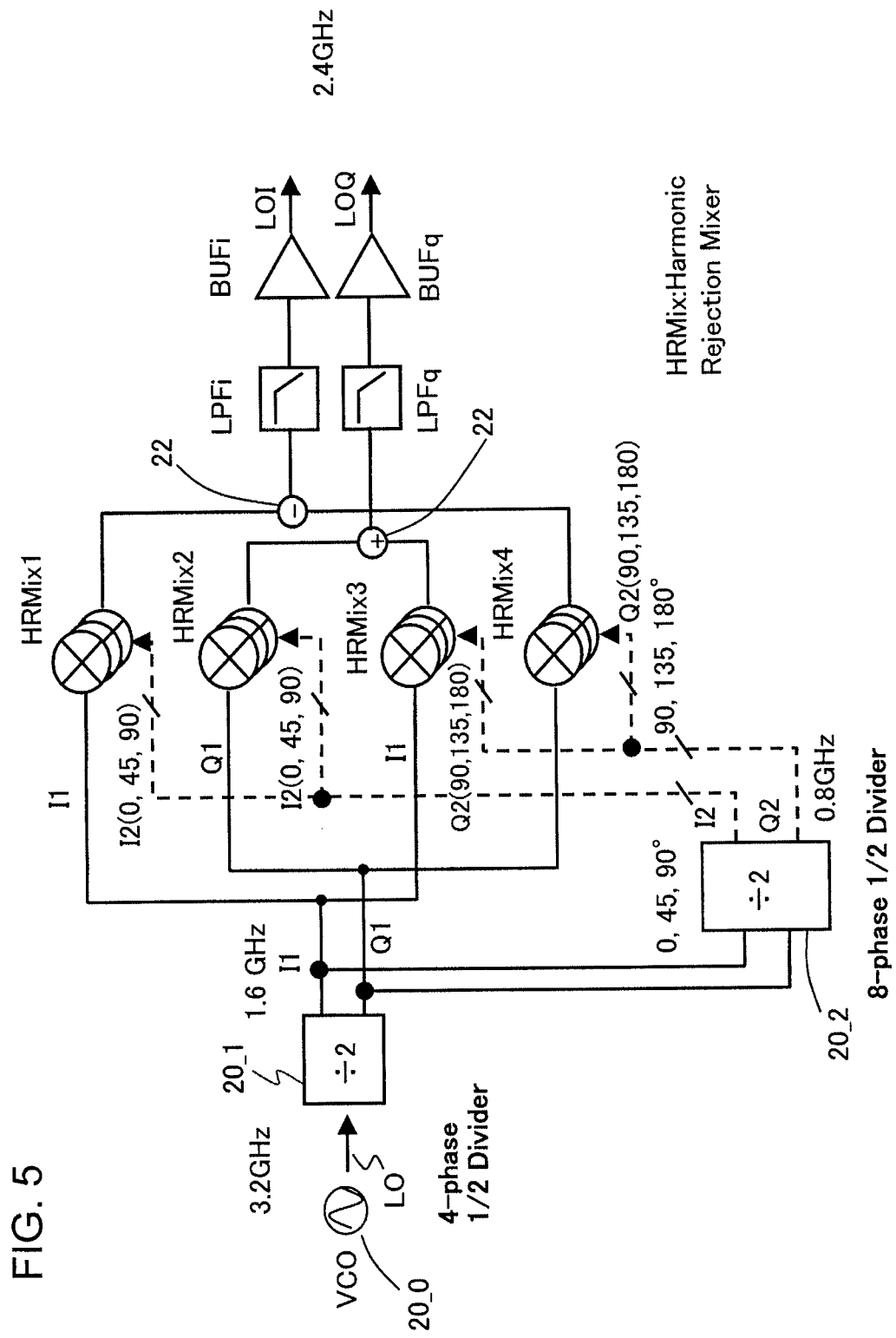
FIG. 5 is a diagram illustrating the signal generator circuit according to the present embodiment.

FIG. 5 is a diagram illustrating the signal generator circuit according to the present embodiment. Each signal line in the figure is depicted with a single line, while a single-phase signal or a differential signal may pass through the signal line. In FIG. 5, each signal is depicted by the single-phase signal.

The signal generator circuit generates the local signals LOI, LOQ from the signal LO generated by a VCO 20_0. As an example, the signal LO generated by the VCO has a frequency of 3.2 GHz, and the local signals LOI, LOQ have a frequency of 2.4 GHz.

The signal generator circuit includes a first frequency divider 20_1 for performing ½ frequency division of the output signal LO of the local oscillator 20_0, to generate a four-phase signal having a ½ frequency of the output signal LO. The four-phase signal generated by the first frequency divider 20_1 is constituted by a first four-phase signal I1(0°), a second four-phase signal Q1(90°) having a phase shifted by 90° therefrom, and negative-phase signals thereof. The negative-phase signals are a third four-phase signal XI1(180°) and a fourth four-phase signal XQ1(270°). The negative-phase signals XI1, XQ1 are not depicted in FIG. 5. In the above example, the four-phase signals I1, Q1 have a frequency of 1.6 GHz.

As described above, the VCO 20_0 and the first frequency divider 20_1 constitute a four-phase signal generator circuit which generates four-phase signals having a first frequency (1.6 GHz, for example). Accordingly, the four-phase signal generator circuit may also be a quadrature oscillator described later.

The second frequency divider 20_2 is an eight-phase signal generator circuit which performs ½ frequency division of the four-phase signals I1, Q1 to generate eight-phase signals I2, Q2. As contrasted with the four-phase signals I1, Q1 having phases mutually shifted by 90°, the eight-phase signals I2, Q2 are signals having phases mutually shifted by 45°. In addition, in the above example, the frequency of the eight-phase signals I2, Q2 is 0.8 GHz, which is ½ of the frequency of the four-phase signals I1, Q1.

An eight-phase signal I2 depicted in the figure is first, second and third eight-phase signals having phases of 0°, 45° and 90°, respectively. An eight-phase signal Q2 depicted in the figure is third, fourth and fifth eight-phase signals having phases of 90°, 135° and 180°, respectively. Eight-phase signals having negative phases to the above eight-phase signals I2, Q2 are an eight-phase signal XI2 having phases of 180°, 225° and 270° and an eight-phase signal XQ2 having phases of 270°, 315° and 360° (=0°). In the figure, these negative-phase signals XI2, XQ2 are not depicted also.

Further, a first to a fourth harmonic rejection mixer circuit HRMix1-HRMix4 perform multiplication of the first four-phase signal I1 and the second four-phase signal Q1 by the first to the third eight-phase signals I2(0, 45, 90) and the third to the fifth eight-phase signals Q2(90, 135, 180) with mutually different combinations.

As a typical example, the first harmonic rejection mixer circuit HRMix1 multiplies the first four-phase signal I1(0) by the first to the third eight-phase signals I2(0, 45, 90). The second harmonic rejection mixer circuit HRMix2 multiplies the second four-phase signal Q1(90) by the first to the third eight-phase signals I2(0, 45, 90). The third harmonic rejection mixer circuit HRMix3 multiplies the first four-phase signal I1(0) by the third to the fifth eight-phase signals Q2(90, 135, 180). Also, the fourth harmonic rejection mixer circuit HRMix4 multiplies the second four-phase signal Q1(90) by the third to the fifth eight-phase signals Q2(90, 135, 180).

When these mixer circuits respectively perform multiplication of differential signals, for example, the first harmonic rejection mixer circuit HRMix1 multiplies the first four-phase signal I1(0) and the third four-phase signal XI1(180) having the negative phase thereof by the first to the third eight-phase signals I2(0, 45, 90) and the fifth to the seventh eight-phase signals XI2(180, 225, 270) having the negative phases thereof. Here, the above negative-phase signals are not depicted in the figure. The same is applicable to the second, the third and the fourth harmonic rejection mixer circuits HRMix2, 3, 4.

Further, there are provided a subtractor 22 which performs subtraction between the outputs of the harmonic rejection mixer circuits HRMix1, HRMix4, and a low-pass filter LPFi which eliminates low frequency components from the output of the subtractor 22. Similarly, there are provided an adder 24 which performs addition between the outputs of the second and the third harmonic rejection mixer circuits HRMix2, HRMix3, and a low-pass filter LPFq which eliminates low frequency components from the output of the adder 24. The outputs of the above adder 22 and the subtractor 24 have a third frequency (2.4 GHz) which is a sum of the first frequency (1.6 GHz) and the second frequency (0.8 GHz) of the inputs. The above arithmetic expression will be described later.

The outputs of the low-pass filters LPFi, LPFq are waveform-shaped by means of buffer circuits BUFi, BUFq. The outputs of the buffer circuits BUFi, BUFq are the local signals LOI, LOQ having phases shifted by 90°.

In the above signal generator circuit, no variation of signal intensity in a desired frequency, which is generated according to the phase relationship of the input signals as depicted in FIG. 3, is produced in the multiplication processing by each harmonic rejection mixer circuit. Further, in the above signal generator circuit, the harmonic rejection mixer circuits performs multiplication with tertiary and quinary harmonic wave components of multiplication signals I2, Q2 being eliminated, and accordingly, it is possible to suppress undesired waves as depicted in FIG. 4. The reason therefor will be described in the following.

Figure 6:
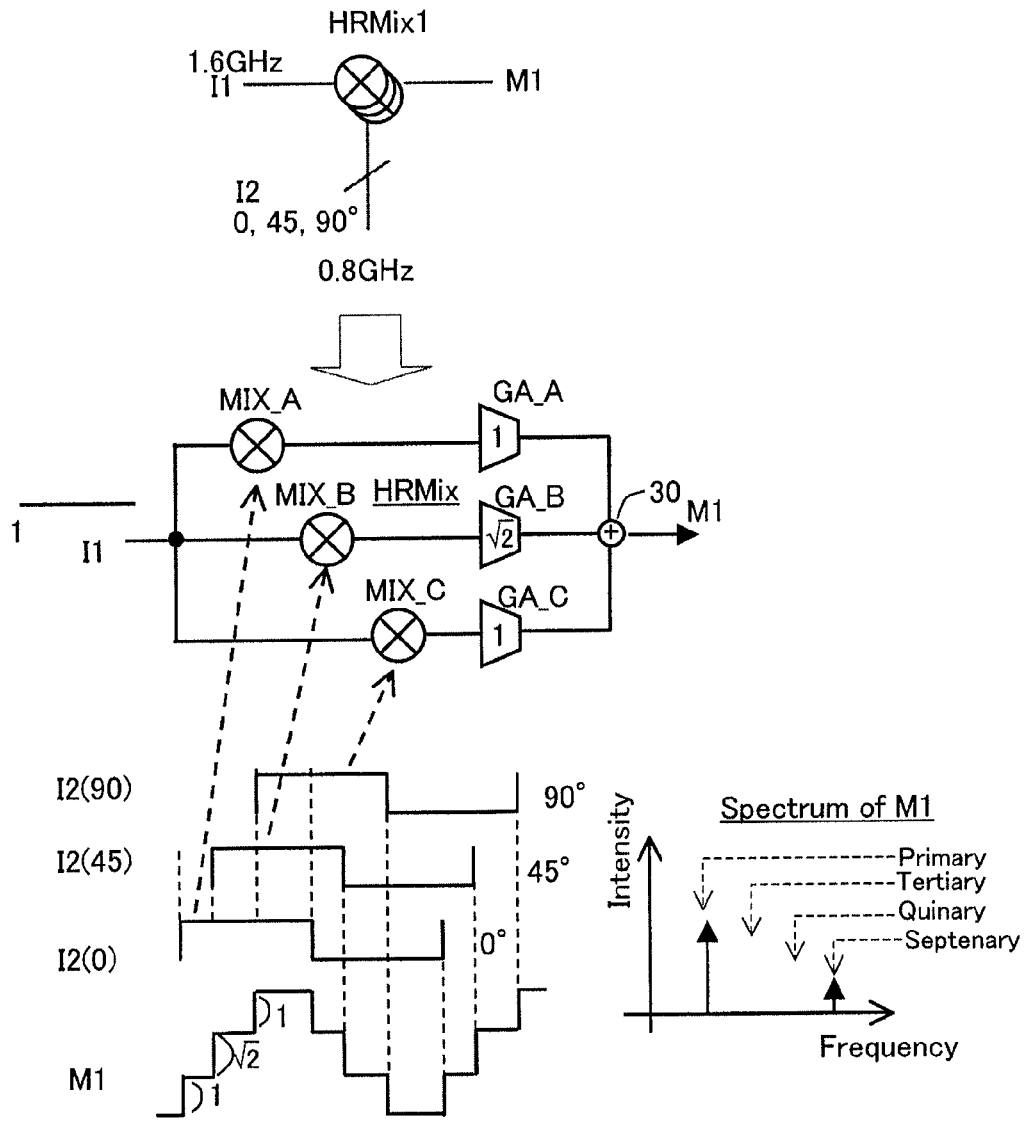
FIG. 6 is an exemplary circuit diagram of a harmonic rejection mixer circuit.

FIG. 6 is an exemplary circuit diagram of a harmonic rejection mixer circuit. The first harmonic rejection mixer circuit HRMix1 includes a first to a third multiplier MIX_A, MIX_B, MIX_C which multiply a first four-phase signal I1 by three, i.e. first to third, eight-phase signals I2(0, 45, 90), respectively, a first to a third gain adjustment circuit GA_A, GA_B, GA_C which perform gain adjustment of the outputs of the first to the third multipliers MIX_A, MIX_B, MIX_C with a ratio of 1:√2:1, and an adder 30 which adds the outputs thereof.

In FIG. 6, there are depicted waveforms when the first four-phase signal I1, an input signal, is a signal "1 (H level)". The phases of the first to the third eight-phase signals I2(0, 45, 90) are 0°, 45° and 90°, respectively. Further, because the first four-phase signal I1 is "1", the outputs of the multipliers MIX_A, MIX_B, MIX_C are identical to the first to the third eight-phase signals I2(0, 45, 90). If the gain adjustment circuits GA_A, GA_B, GA_C adjust the gains with the ratio of 1:√2:1, there are produced level variations of 6 times per period in an added signal M1, as depicted in the figure, and the ratio of the level variations thereof becomes 1:√2:1:1:√2:1. The above signal M1 comes to have a shape closer to a sine wave.

As depicted in the figure, the frequency spectrum of the above added signal M1 includes a primary wave component and harmonic wave components of the septenary, or higher order, of a frequency signal of 2.4 GHz, while the tertiary third and the quinary harmonic wave components are eliminated.

This signifies that the harmonic rejection mixer circuit HRMix1 depicted in FIG. 6 is virtually equivalent to a multiplier which multiplies the first four-phase signal I1, an input signal, by a signal having the waveform of the signal M1 depicted in FIG. 6. In other words, in the output signals LOI, LOQ of the signal generator circuit depicted in FIG. 5, undesired wave components other than the frequency 2.4 GHz of the desired wave are suppressed. Therefore, when such output signals LOI, LOQ are used as the local signal of the radio transmission and reception device, it is possible to suppress undesired wave components from the output of the mixer circuit in the radio transmitter and receiver circuit. Thus, it is possible to suppress the undesired wave components depicted in FIG. 4.

Figure 8:
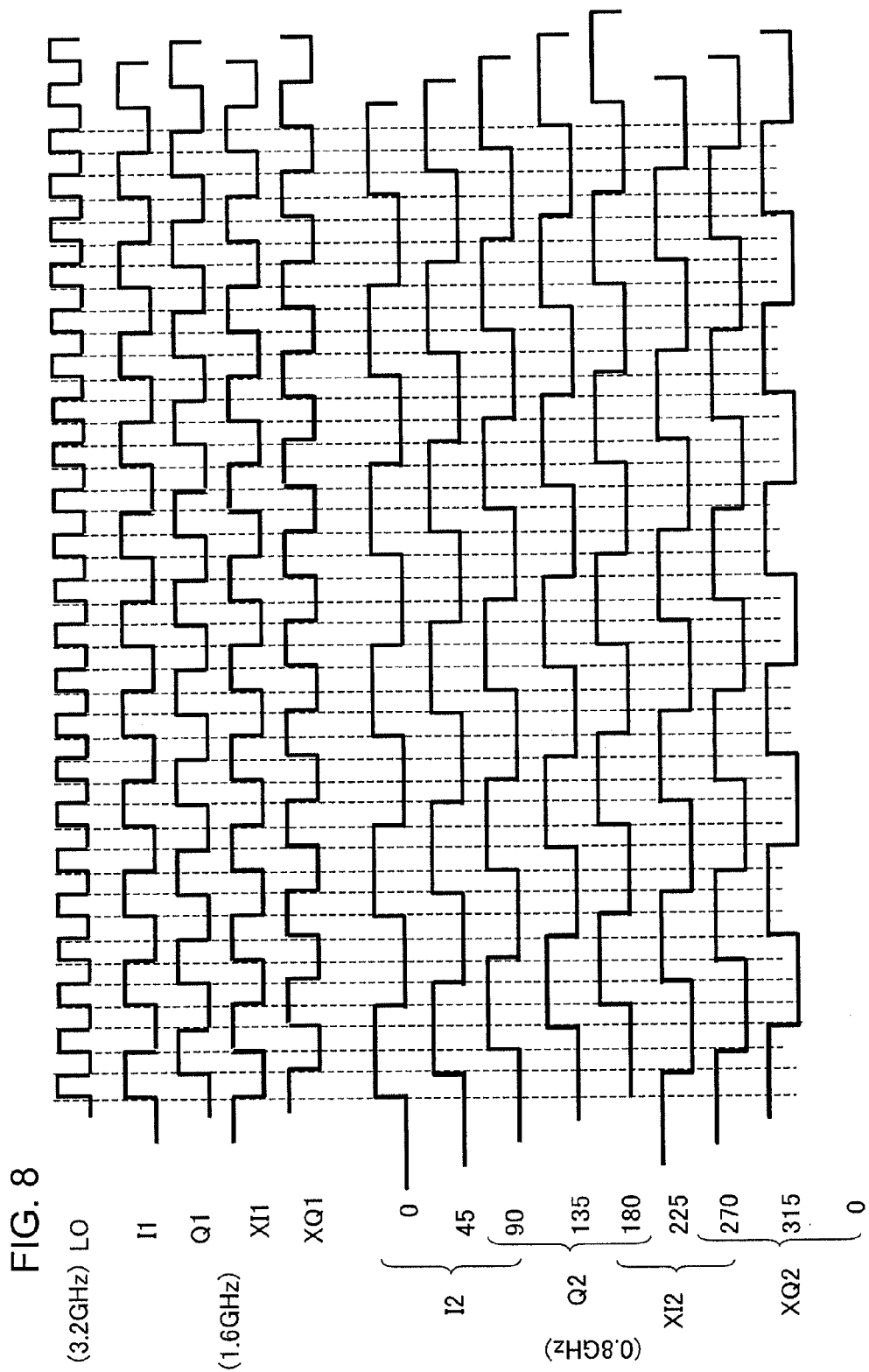
FIG. 8 illustrates signal waveform diagrams of the four-phase signal generator circuit and the eight-phase signal generator circuit.

FIGS. 7A and 7B are diagrams illustrating an example of a four-phase signal generator circuit and an example of an eight-phase signal generator circuit in the signal generator circuit. Also, FIG. 8 illustrates signal waveform diagrams of the four-phase signal generator circuit and the eight-phase signal generator circuit.

A four-phase signal generator circuit 20_1 depicted in FIG. 7A is a frequency divider which performs ½ frequency division of the oscillation signal LO of the VCO 20_0, and includes latch circuits 30, 32. The latch circuit 30 is operated in synchronization with the signal LO which is input to a clock terminal, and the latch circuit 32 is operated in synchronization with an inverted signal XLO of the signal LO which is input to a clock terminal. A differential output of the latch circuit 32 is inverted to be input to a differential input of the latch circuit 30.

By the above frequency divider, the latch circuit 30 outputs the second and the fourth four-phase signals Q1(90), XQ1(270) with a ½ frequency (1.6 GHz), and the latch circuit 32 outputs the first and the third four-phase signals I1(0), XI1(180) with a ½ frequency, 1.6 GHz. These four-phase signals I1(0), Q1(90), XI1(180), XQ1(270) are signals with respective phases shifted by 90°.

An eight-phase signal generator circuit 20_2 depicted in FIG. 7B includes latch circuits 34, 36 constituting a frequency division circuit which performs ½ frequency division of the first four-phase signal I1(0). The configuration of the latch circuits 34, 36 are identical to the configuration depicted in FIG. 7A, and signals generated by the latch circuits 34, 36 are four signals S2(0), S2(90), S2(180), S2(270) of a ½ frequency (0.8 GHz). Further, the eight-phase signal generator circuit 20_2 includes latch circuits 38, 40 which latch the four signals S2(0), S2(90), S2(180), S2(270) at the timing of the second and the fourth four-phase signals Q1(90), XQ1(270). Namely, the latch circuits 38, 40 includes a function of shifting the four signals S2(0), S2(90), S2(180), S2(270) of 0.8 GHz frequency to the timing of the second and the fourth four-phase signals Q1(90), XQ1(270) of 1.6 GHz frequency. Further, times relative to the phase of 90° of the second and the fourth four-phase signals Q1(90), XQ1(270) of 1.6 GHz frequency are times relative to the phase of 45° of the four signals S2(0), S2(90), S2(180), S2(270) of 0.8 GHz frequency. Accordingly, the outputs of the flip-flops 38, 40 are four signals S2(45), S2(135), S2(225), S2(315) having respective phases shifted by 45° from the phases of the four signals S2(0), S2(90), S2(180), S2(270) of the frequency (0.8 GHz). These eight signals S2 constitute an eight-phase signal.

In FIG. 7, there is illustrated relationship between eight-phase signals I2, Q2 depicted in FIG. 5, as well as negative-phase signals XI2, XQ2 thereof, and the above-mentioned eight-phase signals S2(0), S2(45), S2(90), S2(135), S2(180), S2(225), S2(270) and S2(315). According thereto, the followings hold.

I2=S2(0), S2(45), S2(90)
XI2=S2(180), S2(225), S2(270)
Q2=S2(90), S2(135), S2(180)
XQ2=S2(270), S2(315), S2(0)

There will be described arithmetic expressions in regard to the harmonic rejection mixer circuits HRMix1-HRMix4 in the signal generator circuit depicted in FIG. 5, the subtractor 22 and the adder 24. As described in FIG. 6, the harmonic rejection mixer circuit HRMix1 multiplies the first four-phase signal I1(0) by the composite signal M1 of the first, the second and the third eight-phase signals I2(0), I2(45), I2(90). The same is applicable to the other harmonic rejection mixer circuits. Here, on assumption that both the four-phase signal and the eight-phase signal are sine waves or cosine waves, the arithmetic expressions are as follows.

In the case of HRMix1, HRMix4 and the subtractor 22:

$HRMIX1$ $\sin(2\pi^*1.6\ GHz^*t)^*\sin(2\pi^*0.8\ GHZ^*t)$ $= -1/2^*\cos(2\pi^*2.4\ GHz^*t) + 1/2^*\cos(2\pi^*0.8\ GHz^*t)$ $HRMIX4$ $\cos(2\pi^*1.6\ GHz^*t)^*\cos(2\pi^*0.8\ GHz^*t)$ $= 1/2^*\cos(2\pi^*2.4\ GHz^*t) + 1/2^*\cos(2\pi^*0.8\ GHz^*t)$ Therefore, the output LOI of the subtractor 22 is as follows.

HR-MIX1−HR-MIX4=−1*cos(2π*2.4 GHz*t)

Next, in the case of HRMix2, HRMix3 and the adder 24:

$HRMIX2$ $\cos(2\pi^*1.6\ GHz^*t)^*\sin(2\pi^*0.8\ GHz^*t)$ $= -1/2^*\sin(2\pi^*2.4\ GHz^*t) - 1/2^*\sin(2\pi^*0.8\ GHz^*t)$ $HR-MIX3$ $\sin(2\pi^*1.6\ GHz^*t)^*\cos(2\pi^*0.8\ GHz^*t)$ $= 1/2^*\sin(2\pi^*2.4\ GHz^*t) + 1/2^*\sin(2\pi^*0.8\ GHz^*t)$ Therefore, the output LOQ of the adder 24 is as follows.

HR-MIX2+HR-MIX3=sin(2π*2.4 GHz*t)

As such, from both the output LOI of the subtractor 22 and the output LOQ of the adder 24, components of 0.8 GHz frequency are eliminated, and only components of 2.4 GHz frequency are left. Moreover, as described in FIG. 6, each harmonic rejection mixer circuit is equivalent to multiplying by the composite signal M1 of three eight-phase signals. Therefore, by the multiplication of the signal M1 not having tertiary and quinary harmonic waves which are included in a rectangular wave, undesired waves in the vicinity of a frequency of a desired wave are suppressed in the output of each mixer circuit.

Figure 9:
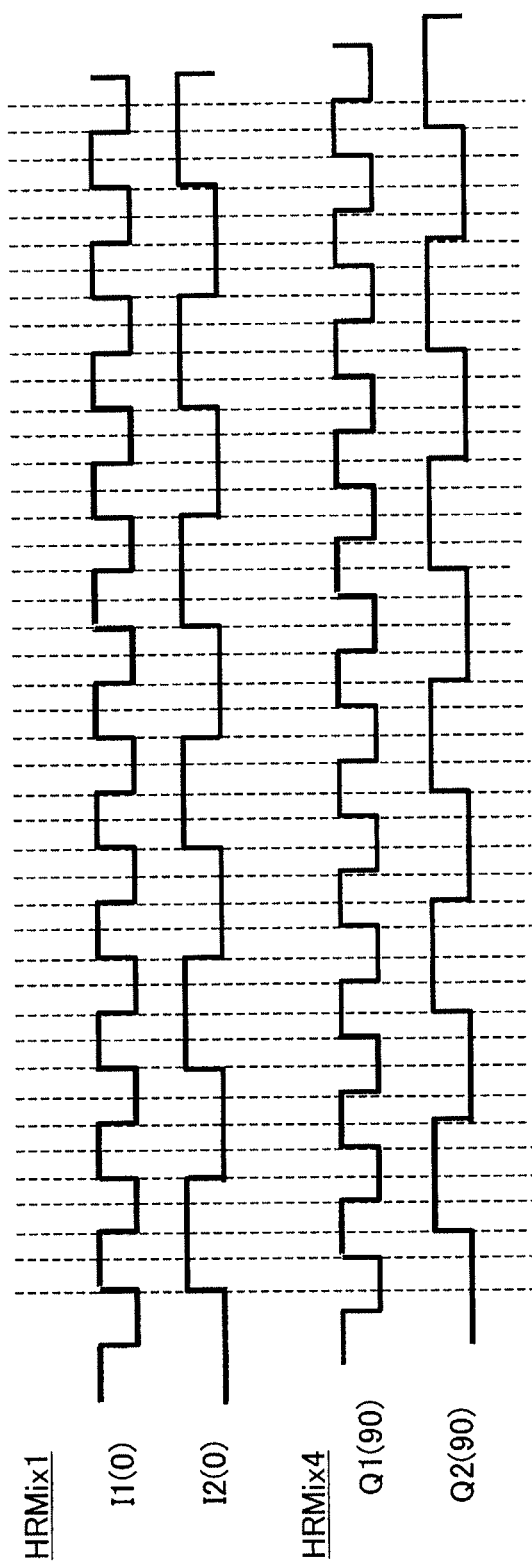
FIG. 9 is a diagram illustrating the operation of the signal generator circuit depicted in FIG. 5.

FIG. 9 is a diagram illustrating the operation of the signal generator circuit depicted in FIG. 5. In FIG. 9, there are depicted signals I1(0), I2(0) and Q1(90), Q2(90) on which multiplication is performed in the harmonic rejection mixer circuits HRMix1 and HRMix4, respectively. The signal I2(0) has an identical phase to the signal M1 obtained by synthesizing three eight-phase signals, and also the signal Q2(90) has an identical phase to the signal M1 obtained by synthesizing three eight-phase signals. Therefore, there will be described a case that phases between signals to be multiplied in the harmonic rejection mixer circuits HRMix1 and HRMix4 are shifted by the above signals I2(0) and Q2(90).

If, in the harmonic rejection mixer circuit HRMix1, the rise edges of the signals I1(0) and I2(0) are coincident, only a signal of 0.8 GHz, not 2.4 GHz, is output, similar to FIG. 3A. However, if the rise edges of the signals I1(0) and I2(0) are coincident, in the harmonic rejection mixer circuit HRMix4, the rise edges of the signal Q1(90) and Q2(90) never coincide. The reason is that, in regard to the signal Q1(90) of 1.6 GHz frequency and the signal Q2(90) of 0.8 GHz frequency, because periods are different therebetween, the timing of the rise edges of both signals are inevitably shifted with each other even if both signals have an identical phase 90°.

Therefore, in the harmonic rejection mixer circuit HRMix1, even when only a signal of 0.8 GHz is output by the coincident rise edges between the signals I1(0) and I2(0), a signal having both frequency components of frequencies 2.4 GHz and 0.8 GHz are inevitably generated in the harmonic rejection mixer circuit HRMix4. As a result, a signal of 2.4 GHz frequency is inevitably included in the output of the subtractor 22. Oppositely, when the rise edges of signals are coincident in the harmonic rejection mixer circuit HRMix4, the signal rise edges are not coincident in the harmonic rejection mixer circuit HRMix1. Therefore, similarly, a signal of 2.4 GHz frequency is inevitably included in the output of the subtractor 22.

The above-mentioned relationship also holds in relationship between the harmonic rejection mixer circuits HRMix2, HRMix3. As such, according to the signal generator circuit depicted in FIG. 5, even on the occurrence of such an event that the rise edges are coincident between signals in one mixer circuit because of dispersion in a circuit delay characteristic etc. as described in FIG. 3, it is invariably possible to generate a signal component of 2.4 GHz, a desired frequency, and it is possible to suppress dispersion of frequency in the generated signal.

Figure 10:
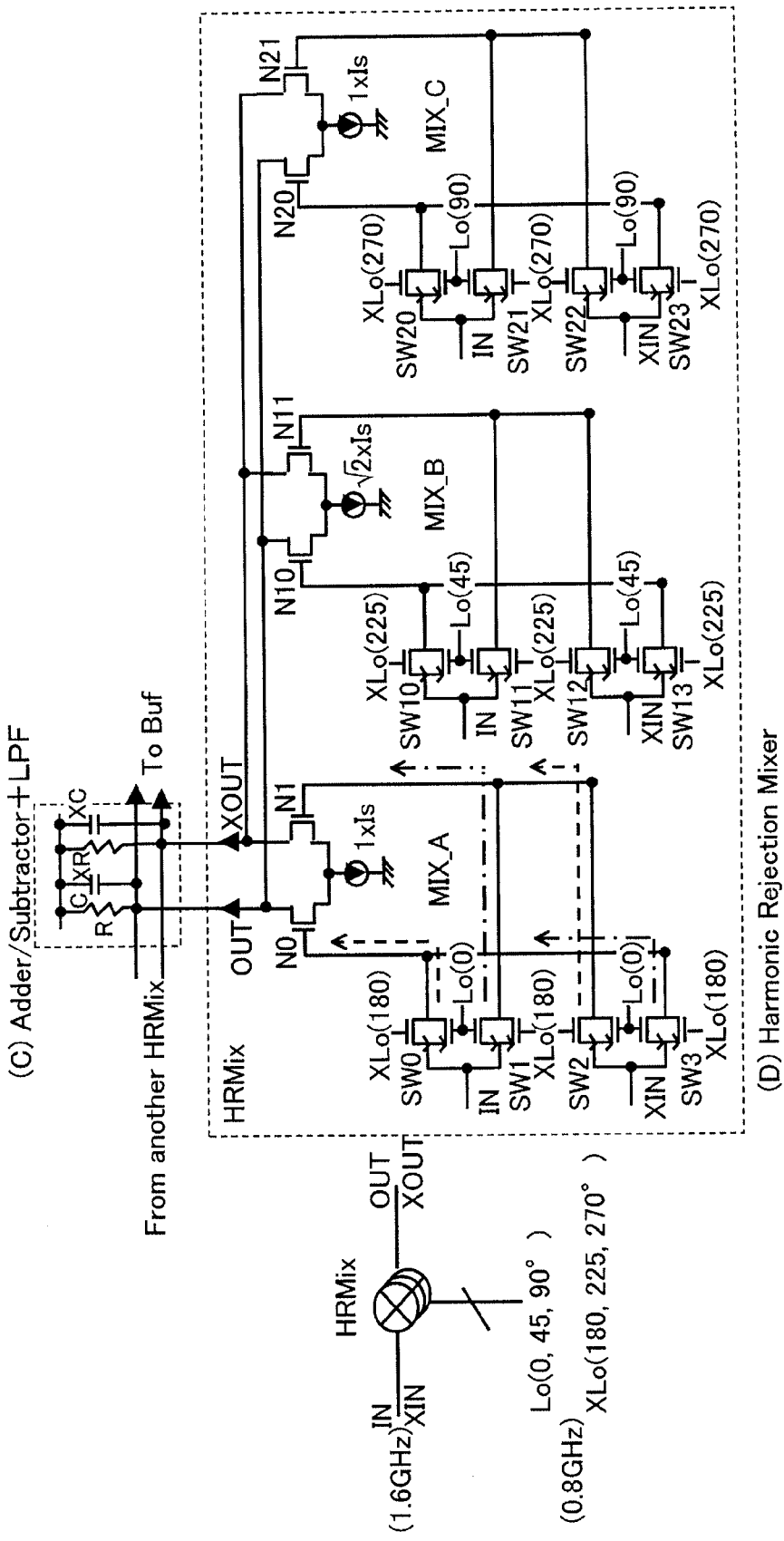
FIG. 10 is a diagram illustrating an example of a typical circuit constituted by harmonic rejection mixer circuit, adder, subtractor and LPF, according to the present embodiment.

FIG. 10 is a diagram illustrating an example of a typical circuit constituted by harmonic rejection mixer circuit, adder, subtractor and LPF, according to the present embodiment. In this circuit diagram, each signal is depicted with a differential signal. In FIG. 10, (D) depicts a circuit diagram of the harmonic rejection mixer circuit HRMix provided for multiplying three signals Lo(0, 45, 90), XLo(180, 225, 270) by inputs IN, XIN, and (C) depicts a circuit diagram of the adder or the subtractor and the low-pass filter LPF, respectively.

In the harmonic rejection mixer circuit depicted in FIG. 10 (D), three mixer circuits MIX_A, MIX_B, MIX_C are constituted by switches SW0, SW1, SW2, SW3 and NMOS transistors N0, N1, switches SW10, SW11, SW12, SW13 and NMOS transistors N10, N11, and switches SW20, SW21, SW22, SW23 and NMOS transistors N20, N21, respectively.

Description will be made on the mixer circuit MIX_A. In the case of the signals Lo(0)=L and XLo(180)=H, the inputs IN, XIN are input to the transistors N0, N1, as depicted with broken lines in the figure. By this, the transistors N0, N1 make a flow of a current source 1×Is to either one of outputs OUT and XOUT. Also, in the case of the signals Lo(0)=H, XLo (180)=L, the inputs IN, XIN are input to the transistors N1, N0 as depicted in the figure with alternate long and short dash lines. By this, the transistors N0, N1 make a flow of the current source 1×Is to either one of the outputs OUT and XOUT. In short, in response to the signals Lo, XLo, the inputs IN, XIN are input to the transistor pair N0, N1 with a positive phase or a negative phase.

In regard to the mixer circuits MIX_B, MIX_C, operation is similar to the above. However, the current source of the mixer circuit MIX_B is $\sqrt{2}\times$Is and the current source of the mixer circuit MIX_C is 1×Is. Therefore, current magnitude of each mixer circuit switched by the transistor pair is gain-adjusted to 1:$\sqrt{2}$:1, and added at outputs OUT, XOUT. The current sources having a current ratio of 1:$\sqrt{2}$:1 correspond to gain adjustment circuits GA_A, GA_B, GA_C.

The adder and the subtractor in (C) of the figure are obtained by connecting the outputs OUT, XOUT of two harmonic rejection mixer circuits HRMix to resistors R, XR, with a positive phase or a negative phase. In the case of the adder, each OUT, XOUT may be connected to the other OUT, XOUT, respectively, while in the case of the subtractor, each OUT, XOUT is connected to the other XOUT, OUT, respectively. Further, the low-pass filter LPF is constituted by the provision of capacitors C, XC. It may also be possible to utilize parasitic capacitance in place of the above capacitors.

The outputs OUT, XOUT are respectively output to buffer circuits BUFi, BUFq in the subsequent stage.

Figure 11:
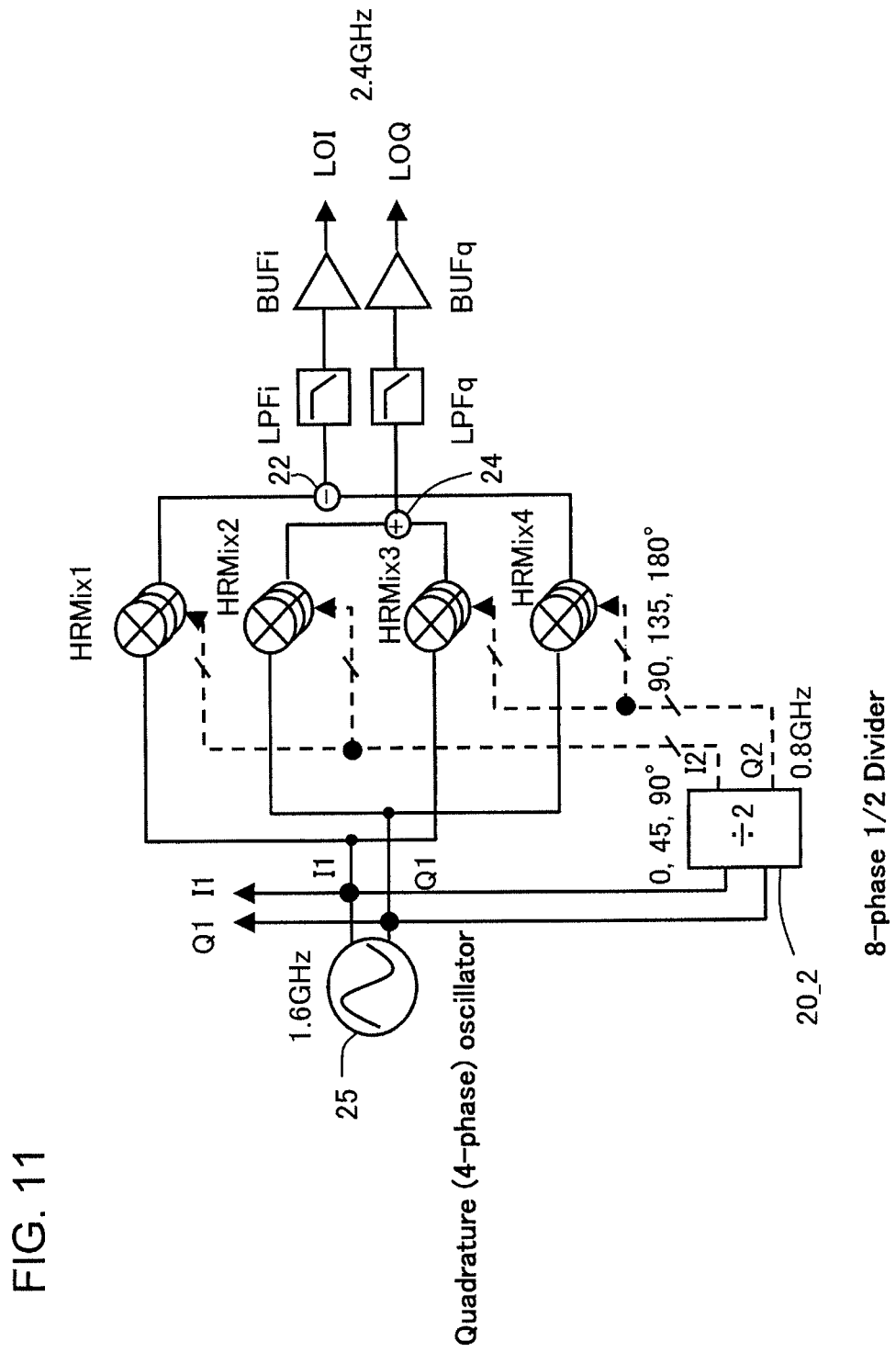
FIG. 11 is a diagram illustrating a deformation example of the signal generator circuit according to the present embodiment.

FIG. 11 is a diagram illustrating a different example of the signal generator circuit according to the present embodiment. A configuration different from the example depicted in FIG. 5 is that a four-phase oscillator (quadrature oscillator) 25 is provided as a circuit to generate four-phase signals I1, Q1 (XI1, XQ1). Other configurations are identical to the configurations depicted in FIG. 5. This signal generator circuit generates the signals I1, Q1 of 1.6 GHz and the signals LOI, LOQ of 2.4 GHz, and by the use thereof for the local signal generator circuit of the mixer circuit of the radio transmission and reception device, it is possible to deal with radio communication of a 1.6 GHz band and a 2.4 GHz band.

Figure 12:
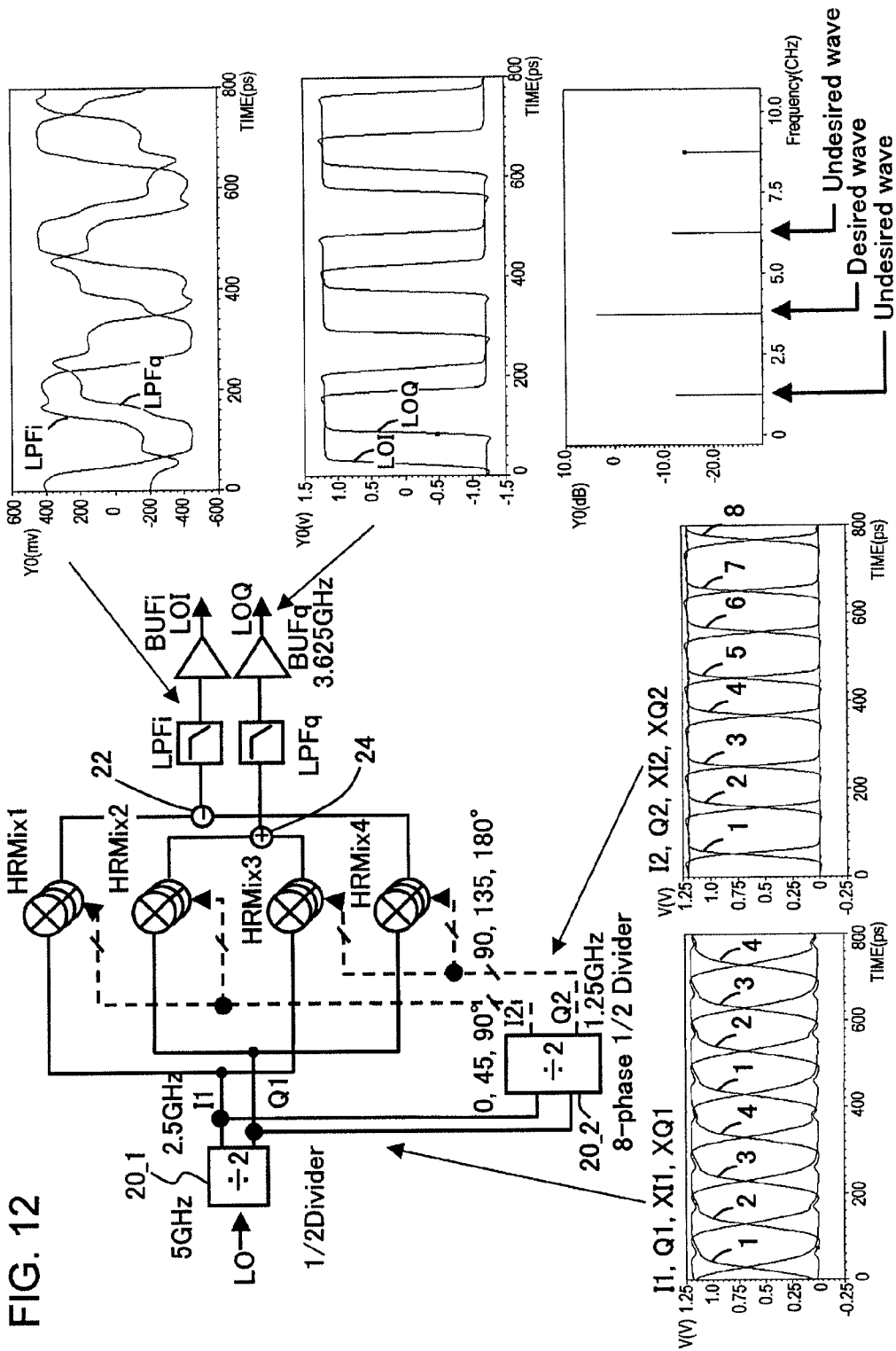
FIG. 12 is a diagram illustrating a simulation result of the signal generator circuit according to the present embodiment.

FIG. 12 is a diagram illustrating a simulation result of the signal generator circuit according to the present embodiment. The signal generator circuit to be simulated is the signal generator circuit depicted in FIG. 5 as illustrated in the figure, which is an example that the frequency of the oscillation signal LO of the VCO 20_0 is set to be 5 GHz. Therefore, the outputs I1, Q1 of the four-phase signal generator circuit 20_1 have 2.5 GHz frequency, the outputs I2, Q1 of the eight-phase signal generator circuit 20_2 have 1.25 GHz frequency, and the frequency of the local signals LOI, LOQ is 3.625 GHz.

In the figure, counterclockwise from the lower left, there are depicted the output waveforms of the four-phase signals I1, Q1, XI1, XQ1, the eight-phase signals I2, Q2, XI2, XQ2, the local signals LOI, LOQ, and the low-pass filters LPFi, LPFq. The local signals LOI, LOQ of buffer outputs are signals with phases mutually shifted by 90°.

Figure 13:
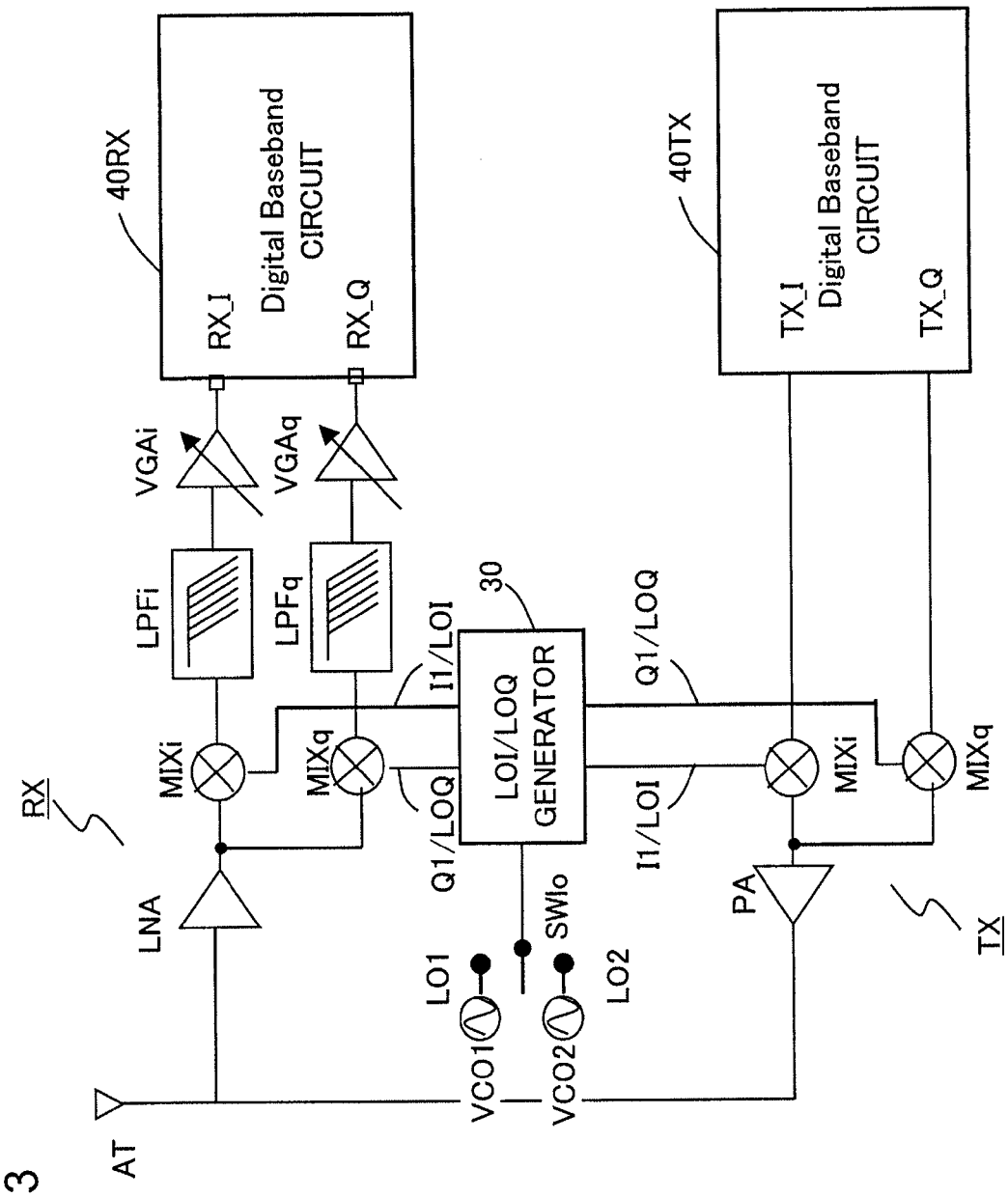
FIG. 13 is a diagram illustrating a radio transmitter and receiver circuit in which the signal generator circuit according to the present embodiment is used.

FIG. 13 is a diagram illustrating a radio transmitter and receiver circuit in which the signal generator circuit according to the present embodiment is used. Similar to FIG. 1, a receiver circuit RX includes a high-frequency circuit constituted by a low-noise amplifier LNA, mixer circuits MIXi, MIXq for frequency down-conversion, low-pass filters LPFi, LPFq and variable gain amplifiers VGAi, VGAq, and a reception-side baseband circuit 40RX which performs demodulation, decoding, etc. on a baseband I-component reception signal RX_I and a Q-component reception signal RX_Q generated by the high-frequency circuit.

On the other hand, a transmitter circuit TX includes a transmission-side baseband circuit 40TX which performs coding, modulation, etc. to generate I-component and Q-component transmission signals TX_I, TX_Q, mixer circuits MIXi, MIXq for up-conversion to a transmission frequency band, and a power amplifier PA.

A signal generator circuit 30 according to the present embodiment supplies the local signals LOI, LOQ or the four-phase signals I1, Q1 to the mixer circuits MIXi, MIXq of the receiver circuit RX and the transmitter circuit TX. In the example depicted in FIG. 5, the frequencies of the above signals are 1.6 GHz and 2.4 GHz, and it is possible to deal with radio communication of different frequency bands.

Further, in FIG. 13, there are provided two VCO1, VCO2 which generate local signals L01, L02 to be supplied to the signal generator circuit 30. The frequencies of the oscillation signals L01, L02 are largely different, which are, for example, 3.2 GHz and 6.4 GHz. Each signal generator circuit depicted in FIGS. 7, 10 is constituted by digital circuits except for the low-pass filter portion, and therefore it is stably operable without dependent on the frequency of the local oscillator circuit. Therefore, it is possible to stably generate the signals I1, Q1, LOI, LOQ to any oscillation signals L01, LO2 having largely different frequencies. By this, in the case of LO1=3.2 GHz, the signal generator circuit 30 generates I1, Q1=1.6 GHz and LOI, LOQ=2.4 GHz, while in the case of LO2=6.4 GHz, the signal generator circuit 30 generates I1, Q1=3.2 GHz and LOI, LOQ=4.8 GHz. Thus, it is possible to obtain the radio transmitter and receiver circuit capable of dealing with radio communication of these four types of frequency bands.

As described above, according to the signal generator circuit of the present embodiment, a signal of a desired frequency is stably generated without dependent on the rise timing of signals input to the mixer circuits, and also, by the use of harmonic rejection mixer circuits, tertiary and quinary harmonic waves are eliminated from multiplication signals, and thus, undesired waves other than the desired frequencies of generated local signals are suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A signal generator circuit comprising:
   a four-phase signal generator circuit which generates four-phase signals with a first frequency;
   an eight-phase signal generator circuit which performs ½ frequency division of the four-phase signals to generate eight-phase signals with a second frequency which is ½ of the first frequency;
   a first to a fourth harmonic rejection mixer circuits which multiply a first four-phase signal and a second four-phase signal of the four-phase signals by a first to a third eight-phase signals and a third to a fifth eight-phase signals of the eight-phase signals with mutually different combinations;
   a subtractor which subtracts between outputs of the first and the fourth harmonic rejection mixer circuits to generate a first output signal with a third frequency which is a sum of the first frequency and the second frequency; and
   an adder which adds between outputs of the second and the third harmonic rejection mixer circuits to generate a second output signal with a third frequency of which phase is different from a phase of the first output signal by $\pi/2$.

2. The signal generator circuit according to claim 1,
   wherein the first harmonic rejection mixer circuit multiplies the first four-phase signal by the first to the third eight-phase signals, and
   the second harmonic rejection mixer circuit multiplies the second four-phase signal by the first to the third eight-phase signals, and
   the third harmonic rejection mixer circuit multiplies the first four-phase signal by the third to the fifth eight-phase signals, and
   the fourth harmonic rejection mixer circuit multiplies the second four-phase signal by the third to the fifth eight-phase signals.

3. The signal generator circuit according to claim 2,
   wherein the first to the fourth harmonic rejection mixer circuits include a first to a third multiplier which respectively multiply the four-phase signals by three of the eight-phase signals, a first to a third gain adjustment circuit which gain-adjust outputs of the first to the third multipliers with a ratio of $1:\sqrt{2}:1$, and an adder which adds outputs of the first to the third gain adjustment circuits together.

4. The signal generator circuit according to claim 1,
   wherein the first harmonic rejection mixer circuit multiplies a differential signal constituted by the first and the third four-phase signals by a differential signal constituted by the first to the third and the fifth to the seventh eight-phase signals, and
   the second harmonic rejection mixer circuit multiplies a differential signal constituted by the second and the fourth four-phase signals by a differential signal constituted by the first to the third and the fifth to the seventh eight-phase signals, and
   the third harmonic rejection mixer circuit multiplies a differential signal constituted by the first and the third four-phase signals by a differential signal constituted by the third to the fifth, the seventh, the eighth and the first eight-phase signals, and
   the fourth harmonic rejection mixer circuit multiplies a differential signal constituted by the second and the fourth four-phase signals by a differential signal constituted by the third to the fifth, the seventh, the eighth and the first eight-phase signals.

5. The signal generator circuit according to claim 1,
   wherein the four-phase signal generator circuit includes a first oscillator and a first frequency divider which performs ½ frequency division of an output signal of the first oscillator to generate the four-phase signals.

6. The signal generator circuit according to claim 5,
   wherein the first oscillator includes a plurality of oscillators which oscillate with mutually different frequencies, and output signals of the plurality of oscillators are input to the first frequency divider in a switchable manner.

7. The signal generator circuit according to claim 1,
   wherein the four-phase signal generator circuit includes a quadrature oscillator which generates the four-phase signals.

8. The signal generator circuit according to claim 1,
   wherein the eight-phase signal generator circuit includes a ½ frequency division unit which performs ½ frequency division of the first four-phase signal to generate first, third, fifth and seventh eight-phase signals, and a latch unit which latches the first, the third, the fifth and the seventh eight-phase signals by the second four-phase signal and an inverted signal thereof, to generate second, fourth, sixth and eighth eight-phase signals.

9. The signal generator circuit according to claim 1, further comprising:
   a first low-pass filter which eliminates predetermined low-frequency components from the output signal of the subtractor; and
   a second local-pass filter which eliminates predetermined low-frequency components from the output signal of the adder.

10. A radio transmission and reception device comprising:
    the signal generator circuit as described in claim 1; and
    a first and a second mixer circuit which multiply a transmission signal or a reception signal by the first and the second output signals or the first and the second four-phase signals, respectively, generated by the signal generator circuit.

* * * * *